(12) United States Patent
Takahashi

(10) Patent No.: US 7,804,225 B2
(45) Date of Patent: Sep. 28, 2010

(54) DROPLET DISCHARGING HEAD, IMAGE FORMING APPARATUS, AND FILM FORMING APPARATUS

(75) Inventor: Hayato Takahashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 437 days.

(21) Appl. No.: 11/688,046

(22) Filed: Mar. 19, 2007

(65) Prior Publication Data

US 2007/0216263 A1    Sep. 20, 2007

(30) Foreign Application Priority Data

Mar. 17, 2006    (JP) .............................. 2006-075507

(51) Int. Cl.
*H01L 41/08* (2006.01)
(52) U.S. Cl. .................... 310/324; 318/328; 347/72
(58) Field of Classification Search .................. 310/328
See application file for complete search history.

(56) References Cited

U.S. PATENT DOCUMENTS

| | | | |
|---|---|---|---|
| 4,593,658 A | * | 6/1986 | Moloney ................... 123/90.11 |
| 5,381,171 A | * | 1/1995 | Hosono et al. ................. 347/72 |
| 5,942,837 A | * | 8/1999 | Reuter ......................... 310/328 |
| 6,066,911 A | * | 5/2000 | Lindemann et al. ..... 310/323.02 |

FOREIGN PATENT DOCUMENTS

| | | |
|---|---|---|
| JP | A 07-156397 | 6/1995 |
| JP | A 9-147837 | 6/1997 |
| JP | A 2003-072066 | 3/2003 |
| JP | A 2003-92437 | 3/2003 |
| JP | A 2004-82517 | 3/2004 |
| JP | A 2004-142438 | 5/2004 |
| JP | A 2004-160941 | 6/2004 |
| JP | A 2005-088436 | 4/2005 |
| JP | A 2005-287100 | 10/2005 |

* cited by examiner

*Primary Examiner*—Mark Budd
(74) *Attorney, Agent, or Firm*—Workman Nydegger

(57) ABSTRACT

A droplet discharging head, includes a diaphragm, a fixing plate, and a piezoelectric element. The piezoelectric element includes a first electrode, a second electrode, a piezoelectric body layer interposed between the first and second electrodes, a first internal electrode extending from the first electrode between the first, and second electrodes, and a second internal electrode extending from the second electrode between the first and second electrodes. At least a part of a first end face of the piezoelectric element is in contact with the diaphragm. The first end face includes a first end of the first electrode, a first end of the second electrode, and a first end of the piezoelectric Body. The piezoelectric body layer includes an active layer that overlaps both the first and second internal electrodes, a first inactive layer that overlaps only the first internal electrode, and a second inactive layer that overlaps only the second internal electrode. A thickness of the second inactive layer between the second electrode and the active layer is larger than a thickness of the first inactive layer between the first electrode and the active layer.

10 Claims, 4 Drawing Sheets

DROPLET DISCHARGING HEAD, IMAGE FORMING APPARATUS, AND FILM FORMING APPARATUS

BACKGROUND

1. Technical Field

Several aspects of the present invention relate to a droplet discharging head, an image forming apparatus, and a film forming apparatus.

2. Related Art

As the industrial application of inkjet technologies proceeds, droplet discharging heads are required to discharge more minute droplets in order to form a finer wiring pattern or the like. In order to make droplets to be discharged more minute, it is necessary to use an actuator that can be driven by high frequency signals and ensure necessary and sufficient displacements (see JP-A-2003-92437 as a related art example). To meet such necessity, for example, displacements of a piezoelectric element in the d33 direction can be effectively used.

In the aforementioned related art example, a notch is provided in a portion of a side of the piezoelectric element that is joined to a fixing plate for an individual electrode. This prevents a short circuit from occurring on the side of the piezoelectric element that is joined to the fixing plate. However, when a conductive diaphragm is used, a short circuit occurs on a side of the piezoelectric element that is joined to the diaphragm. Additionally, providing a notch in a portion of the piezoelectric element may make the shape of the piezoelectric element nonuniform when electrostriction occurs.

SUMMARY

An advantage of the invention is to provide a droplet discharging head, an image forming apparatus, and a film forming apparatus that improve the uniformity of the shape of a piezoelectric element and thereby improve the accuracy of discharging of a liquid material.

A droplet discharging head according to a first aspect of the invention includes a diaphragm, a fixing plate, and a piezoelectric element. The piezoelectric element includes a first electrode, a second electrode, a piezoelectric body layer interposed between the first and second electrodes, a first internal electrode extending from the first electrode between the first and second electrodes, and a second internal electrode extending from the second electrode between the first and second electrodes. At least a part of a first end face of the piezoelectric element is in contact with the diaphragm. The first end face includes a first end of the first electrode, a first end of the second electrode, and a first end of the piezoelectric body layer. At least a part of a second end face of the piezoelectric element is in contact with the fixing plate. The second end face includes a second end of the first electrode and a second end of the piezoelectric body layer. At least a part of the first end of the piezoelectric body layer lies between the diaphragm and the first end of the second electrode. At least a part of the second end of the piezoelectric body layer lies between the fixing plate and a second end of the second electrode. The piezoelectric body layer includes an active layer that overlaps both the first and second internal electrodes, a first inactive layer that overlaps only the first internal electrode, and a second inactive layer that overlaps only the second internal electrode. A thickness of the second inactive layer between the second electrode and the active layer is larger than a thickness of the first inactive layer between the first electrode and the active layer. Consequently, it is possible to improve the uniformity of the shape of the piezoelectric element at the time of extension/contraction of the piezoelectric element and thereby to improve the accuracy of discharging of a liquid material.

A droplet discharging head according to a second aspect of the invention includes a diaphragm, a fixing plate, and a piezoelectric element. The piezoelectric element includes a first electrode, a second electrode, and a piezoelectric body layer interposed between the first and second electrodes. At least a part of a first end face of the piezoelectric element is in contact with the diaphragm. The first end face includes a first end of the second electrode and a first end of the piezoelectric body layer. At least a part of a second end face of the piezoelectric element is in contact with the fixing plate. The second end face includes a second end of the second electrode and a second end of the piezoelectric body layer. The diaphragm is in contact with the first end of the second electrode. At least a part of the first end of the piezoelectric body layer lies between the fixing plate and the second end of the second electrode. Consequently, it is possible to improve the uniformity of the shape of the piezoelectric element at the time of extension/contraction of the piezoelectric element and thereby to improve the accuracy of discharging of a liquid material.

A droplet discharging head according to a third aspect of the invention includes a diaphragm, a fixing plate, and a piezoelectric element. The piezoelectric element includes a first electrode, a second electrode, and a piezoelectric body layer interposed between the first and second electrodes. At least a part of a first end face of the piezoelectric element is in contact with the diaphragm. The first end face includes a first end of the first electrode and a first end of the piezoelectric body layer. At least a part of a second end face of the piezoelectric element is in contact with the fixing plate. The second end face includes a second end of the piezoelectric body layer. At least a part of the first end of the piezoelectric body layer lies between the diaphragm and the first end of the first electrode. Consequently, it is possible to improve the uniformity of the shape of the piezoelectric element at the time of extension/contraction of the piezoelectric element and thereby to improve the accuracy of discharging of a liquid material.

A droplet discharging head according to a fourth aspect of the invention includes a diaphragm, a fixing plate, and a piezoelectric element. The piezoelectric element includes a first electrode, a second electrode, and a piezoelectric body layer interposed between the first and second electrodes. At least a part of a first end face of the piezoelectric element is in contact with the diaphragm. The first end face includes a first end of the second electrode and a first end of the piezoelectric body layer. At least a part of a second end face of the piezoelectric element is in contact with the fixing plate. The second end face includes a second end of the piezoelectric body layer. At least a part of the first end of the piezoelectric body layer lies between the diaphragm and the first end of the second electrode. Consequently, it is possible to improve the uniformity of the shape of a piezoelectric element at the time of extension/contraction of the piezoelectric element and thereby to improve the accuracy of discharging of a liquid material.

In the droplet discharging head according to the fourth aspect of the invention, the first end face of the piezoelectric element preferably includes a first end of the first electrode. At least a part of the first end of the piezoelectric body layer preferably lies between the diaphragm and a first end of the first electrode. Consequently, it is possible to increase flexibility in disposition of the piezoelectric element and thereby, for example, to design a finer head.

In the droplet discharging head according to the second aspect of the invention, the first end face of the piezoelectric element preferably includes a first end of the first electrode. The first end of the first electrode is preferably in contact with the diaphragm. Consequently, it is possible to increase flexibility in disposition of the piezoelectric element and thereby, for example, to design a finer head.

In the droplet discharging head according to the first aspect of the invention, the second end face of the piezoelectric element preferably includes a second end of the first electrode. The fixing plate is preferably in contact with the second end of the first electrode.

In the droplet discharging head according to the third aspect of the invention, the second end face of the piezoelectric element preferably includes a second end of the second electrode. At least a part of the second end of the piezoelectric body layer preferably lies between the fixing plate and a second end of the second electrode. Consequently, it is possible to increase flexibility in disposition of the piezoelectric element and thereby, for example, to design a finer head.

In the droplet discharging head according to the second aspect of the invention, the second end face of the piezoelectric element preferably includes the second end of the second electrode. The diaphragm is preferably in contact with the first end of the second electrode. Consequently, it is possible to increase flexibility in disposition of the piezoelectric element and thereby, for example, to design a finer head.

In the droplet discharging head according to the fourth aspect of the invention, the second end face of the piezoelectric element preferably includes a second end of the second electrode. The fixing plate is preferably in contact with the second end of the second electrode. Consequently, it is possible to increase flexibility in disposition of the piezoelectric element and thereby, for example, to design a finer head.

In the droplet discharging head according to the second aspect of the invention, the fixing plate is preferably conductive. Consequently, it is possible to simplify the structure for applying a potential to the piezoelectric element and thereby, for example, to design a finer head.

In the droplet discharging head according to the third aspect of the invention, the diaphragm is preferably conductive. Consequently, it is possible to simplify the structure for applying a potential to the piezoelectric element and thereby, for example, to design a finer head.

In the droplet discharging head according to the first aspect of the invention, the second electrode is preferably coupled to a printed board. Consequently, it is possible to simplify the structure for applying a potential to the piezoelectric element and thereby, for example, to design a finer head.

In the droplet discharging head according to the first aspect of the invention, at least the part of the first end face of the piezoelectric element is preferably in contact with a protrusion of the diaphragm. Consequently, it is possible to increase flexibility in disposition of the piezoelectric element and thereby, for example, to design a finer head.

In the droplet discharging head according to the second aspect of the invention, the piezoelectric element preferably includes a first internal electrode extending from the first electrode between the first and second electrodes and a second internal electrode extending from the second electrode between the first and second electrodes. The piezoelectric body layer preferably includes an active layer that overlaps both the first and second internal electrodes, a first inactive layer that overlaps only the first internal electrode, and a second inactive layer that overlaps only the second internal electrode. A thickness of the first inactive layer between the first electrode and the active layer and a thickness of the second inactive layer between the second electrode and the active layer are preferably different from each other. Consequently, it is possible to improve the uniformity of the shape of the piezoelectric element at the time of extension/contraction of the piezoelectric element and thereby to improve the accuracy of discharging of a liquid material.

The droplet discharging head according to the first aspect of the invention also preferably includes a base coupled to the diaphragm. The base preferably includes a pressure chamber that retains a liquid material, and a portion defining an discharging port through which the liquid material is discharged.

The droplet discharging head according to the first aspect of the invention also preferably includes a flow channel substrate coupled to the diaphragm and a nozzle plate coupled to the flow channel substrate. The flow channel substrate preferably includes a pressure chamber that retains a liquid material. The nozzle plate preferably includes a portion defining an discharging port through which the liquid material is discharged.

An image forming apparatus according to a fifth aspect of the invention includes the droplet discharging head according to the first aspect of the invention.

A film forming apparatus according to a sixth aspect of the invention includes the droplet discharging head according to the first aspect of the invention.

BRIEF DESCRIPTION OF THE DRAWINGS

The invention will be described with reference to the accompanying drawings, where like numbers reference like elements.

DESCRIPTION OF EXEMPLARY EMBODIMENTS

Embodiments of the invention will now be described with reference to the accompanying drawings. In those drawings, members are differently scaled so as to be recognizable.

First Embodiment

Figure 1:
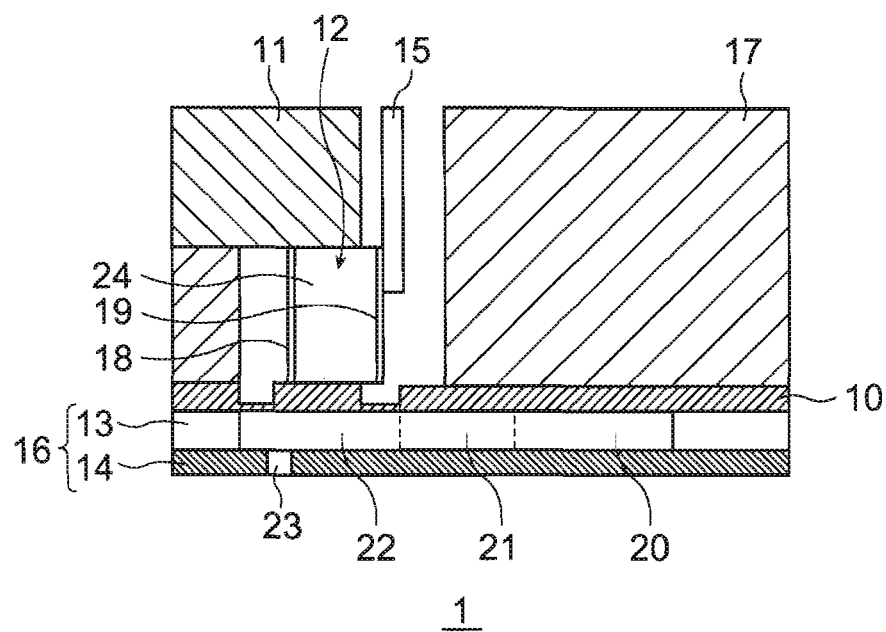
FIG. 1 is a schematic sectional view of a droplet discharging head according to a first embodiment of the invention.

FIG. 1 is a schematic sectional view of a droplet discharging head according to a first embodiment. A droplet discharging head 1 shown in FIG. 1 includes a diaphragm 10, a fixing plate 11, a piezoelectric element 12, a flow channel substrate 13, a nozzle plate 14, a printed board 15, and a frame 17.

The diaphragm 10 is formed of, for example, a metal plate made of nickel or the like. As shown in the drawing, a portion of the diaphragm 10 that is in contact with the piezoelectric element 12 is separated from the other portions of the diaphragm 10, taking the shape of an island. Provided around the separated portion (protrusion) is a thin film. The protrusion and the other portions of the diaphragm 10 are integrated with the thin film therebetween. The diaphragm 10 may also be formed of a multilayer substrate including a metal plate and a resin plate.

The fixing plate 11 is a member that extends in a direction perpendicular to the paper surface on which FIG. 1 is drawn. The fixing plate 11 is formed of; for example, a metal member made of stainless steel or the like, a ceramic member, or other various members. The primary function of the fixing plate 11 is to fix and thereby support the piezoelectric element 12. Therefore the material, shape, and the like for the fixing plate 11 are selected so that the fixing plate 11 has sufficient mechanical strength to perform such a function.

The piezoelectric element 12 is displaced according to drive signals supplied via the printed board 15 (flexible printed board). This displacement is transferred to the diaphragm 10 that is in contact with the piezoelectric element 12. As shown in the drawing, the piezoelectric element 12 includes a first electrode 18, a second electrode 19, and a piezoelectric body layer 24 interposed between the first and second electrodes 18 and 19.

The flow channel substrate 13 is a substrate in which there is formed a flow channel that supplies a liquid to be discharged from the nozzle opening (discharging port) 23 of the droplet discharging head 1. The flow channel substrate 13 is joined to the diaphragm 10. The flow channel substrate 13 includes a common liquid chamber 20, a flow channel 21, and a pressure chamber 29. This flow channel substrate 13 is formed, for example, by performing anisotropic etching on a monocrystal silicon substrate having crystal orientation (110). The liquid that fills the common liquid chamber 20 is supplied to the pressure chamber 22 via the flow channel 21. As shown in the drawing, the island-shaped portion of the diaphragm 10 is in contact with the pressure chamber 22. Displacements of the piezoelectric element 12 are transferred to the pressure chamber 22 via the island-shaped portion to change the internal pressure of the pressure chamber 22. Thus a minute amount of the liquid (droplet) is discharged from the nozzle opening 23 that communicates with the pressure chamber 22.

The nozzle plate 14 has a plurality of nozzle openings 23 arranged in a direction perpendicular to the paper surface on which FIG. 1 is drawn. The nozzle plate 14 is joined to the flow channel substrate 13. The nozzle openings 23 are each an opening having a diameter of, e.g., several μm and are arranged corresponding to the pressure chamber 22 of the flow channel substrate 13. This nozzle plate 14 is formed, for example, by etching a glass substrate. The nozzle plate 14 and the flow channel substrate 13 are included in a base 16.

The frame 17 is a member that extends in a direction perpendicular to the paper surface on which FIG. 1 is drawn. The frame 17 is formed of, for example, a metal member made of stainless steel or the like, a ceramic member, or other various members. The primary function of the frame 17 is to support and integrate the diaphragm 10, fixing plate 11, and base 16 (flow channel substrate 13 and nozzle plate 14). Therefore the material, shape, and the like for the frame 17 are selected so that the frame 17 has sufficient mechanical strength to perform such a function.

Figure 2:
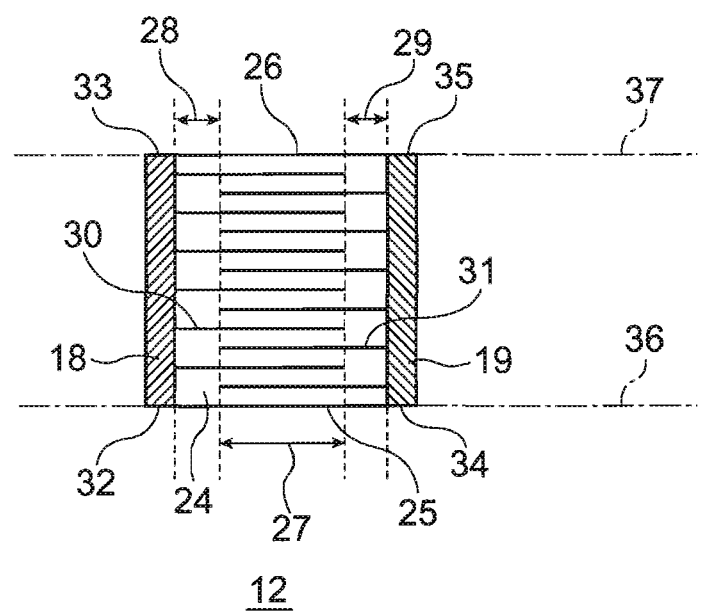
FIG. 2 is a schematic sectional view showing an example of a piezoelectric element used for the droplet discharging head.

FIG. 2 is a schematic sectional view showing an example of the piezoelectric element used in the abovedescribed droplet discharging head. In this embodiment, a piezoelectric element in which electrostriction occurs in the d33 direction is used. The "d" here is a coefficient (piezoelectric coefficient) representing a degree of ease with which the piezoelectric body is deformed when a voltage is applied to the piezoelectric body. The d33 direction means that when an electric field is given in a direction perpendicular to an electrode surface (direction of the thickness of the piezoelectric body layer 24), the piezoelectric body is deformed in the same direction (direction of the thickness of the piezoelectric body layer 24). As shown in the drawing, the piezoelectric element 12 includes a plurality of first internal electrodes 30 that extend from the first electrode 18 between the first and second electrodes 18 and 19 and a plurality of second internal electrodes 31 that extend from the second electrode 19 between the first and second electrodes 18 and 19. The plurality of first internal electrodes 30 are disposed at intervals in the form of a comb inside the piezoelectric body layer 24. Similarly the plurality of second internal electrodes 31 are disposed at intervals in the form of a comb inside the piezoelectric body layer 24. As shown in the drawing, the first and second internal electrodes 30 and 31 are staggered one by one. This makes it possible to generate an electric field parallel to a direction of disposition of the first and second internal electrodes 30 and 31 (vertical direction of the drawing) by applying a voltage between the first and second electrodes 18 and 19.

As shown in FIG. 2, the piezoelectric body layer 24 includes an active layer 27 that overlaps both the first and second internal electrodes 30 and 31, a first inactive layer 28 that overlaps only the first internal electrodes 30, and a second inactive layer 29 that overlaps only the second internal electrodes 31. A first end 32 of the first electrode 18, a first end 25 of the piezoelectric body layer 24, and a first end 34 of the second electrode 19 are disposed on an identical plane. This plane is a first end face 36 of the piezoelectric element 12. Similarly, a second end 33 of the first electrode 18, a second end 26 of the piezoelectric body layer 24, and a second end 35 of the second electrode 19 are disposed on an identical plane. This plane is a second end face 37 of the piezoelectric element 12.

Positional relations among the diaphragm 10, fixing plate 11, and piezoelectric element 12 will now be described referring to partial schematic sectional views shown in FIGS. 3A to 3E.

Figure 3A:
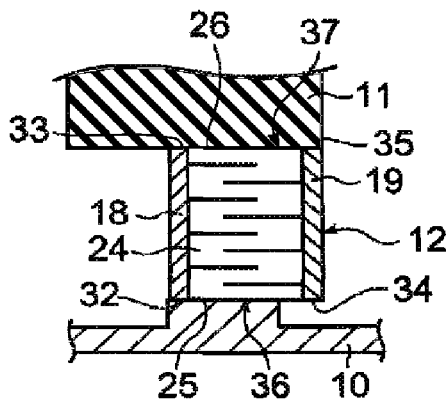
FIGS. 3A to 3E are partial schematic sectional views showing positional relations among a diaphragm, a fixing plate, and the piezoelectric element.

FIG. 3A is a schematic sectional view showing the diaphragm, fixing plate, and piezoelectric element when the fixing plate is an insulator and the diaphragm is a conductor. In this example, at least a part of the first end face 36 of the piezoelectric element 12 is in contact with the diaphragm 10. Specifically, of the first end face 36, the first end 32 of the first electrode 18 and the first end 25 of the piezoelectric body layer 24 are in contact with the diaphragm 10; the first end 34 of the second electrode 19 is not in contact with the diaphragm 10. In the illustrated example, the diaphragm 10 and piezoelectric element 12 are relatively disposed so that a part of the first end 25 of the piezoelectric body layer 24 lies between the diaphragm 10 and the first end 34 of the second electrode 19. The approximately entire first end 25 of the piezoelectric body layer 24 may be in contact with the diaphragm 10 unless the second electrode 19 and the diaphragm 10 come into contact with each other. The fixing plate 11 is an insulator, so no short circuit occurs between the first and second electrodes 18 and 19.

The second end 33 of the first electrode 18, the second end 35 of the second electrode 19, and the second end 26 of the piezoelectric body layer 24 included in the second end face 37 of the piezoelectric element 12 may all be in contact with the fixing plate 11. Alternatively, at least the second end 26 of the piezoelectric body layer 24 may be in contact with the fixing plate 11. Alternatively the second end 26 of the piezoelectric body layer 24 and the second end 33 of the first electrode 18, or the second end 26 of the piezoelectric body layer 24 and the second end 35 of the second electrode 19 may be in contact with the fixing plate 11.

Therefore, continuity is established between the first electrode 18 and the diaphragm 10, which is a conductor, allowing a potential to be applied to the first electrode 18 using the diaphragm 10. On the other hand, for example, coupling the printed board 15 to the second electrode 19 as shown in FIG. 1 enables a potential to be applied to the second electrode 19. Structurally no continuity is established between the second electrode 19 and the diaphragm 10. Therefore, it is possible to prevent a short circuit from occurring between the first and second electrodes 18 and 19.

In particular, in order to fix the piezoelectric element 12 stably, it is preferable that the fixing plate 11 and piezoelectric element 12 be relatively disposed so that the second end 33 of the first electrode is in contact with the fixing plate 11 and that a part of the second end 26 of the piezoelectric body layer 24 lies between the fixing plate 11 and the second end 35 of the second electrode 19. According to these features, the area of a part of the first end face 36 of the piezoelectric element 12 that is in contact with the diaphragm 10 is approximately equal to that of a part of the second end face 37 that is in contact with the fixing plate 11. Additionally, a part of the diaphragm 10 and a part of the fixing plate 11 between which the piezoelectric element 12 is interposed are axisymmetrical to each other. This allows the piezoelectric element 12 to be fixed stably.

Figure 3B:
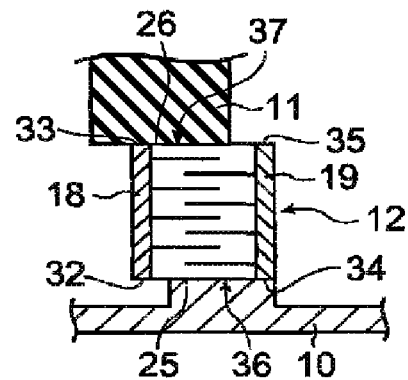

FIG. 3B is a schematic sectional view showing the diaphragm, fixing plate, and piezoelectric element when the fixing plate and the diaphragm are each a conductor. In this example, at least a part of the first end face 36 of the piezoelectric element 12 is in contact with the diaphragm 10. Specifically, of the first end face 36, the first end 34 of the second electrode 19 and the first end 25 of the piezoelectric body layer 24 are in contact with the diaphragm 10; the first end 32 of the first electrode 18 is not in contact with the diaphragm 10. In the illustrated example, the diaphragm 10 and piezoelectric element 12 are relatively disposed so that a part of the first end 25 of the piezoelectric body layer 24 lies between the diaphragm 10 and the first end 32 of the first electrode 18. Also, in the FIG. 3B, at least a part of the second end face 37 of the piezoelectric element 12 is in contact with the fixing plate 11. Specifically, in the illustrated example, the second end 33 of the first electrode 18 and the second end 26 of the piezoelectric body layer 24 included in the second end face 37 are in contact with the fixing plate 11. The fixing plate 11 and piezoelectric element 12 are relatively disposed so that a part of the second end 26 of the piezoelectric body layer 24 lies between the fixing plate 11 and the second end 35 of the second electrode 19. According to these features, there occurs no short circuit between the first and second electrodes 18 and 19 via the diaphragm 10 or fixing plate 11. This allows a potential to be applied to the first electrode 18 and the second electrode 19 using the fixing plate 11 and the diaphragm 10, respectively.

The positional relations among the diaphragm 10, fixing plate 11, and piezoelectric element 12 shown in FIG. 3B may be reversed. Specifically, the first end face 36 of the piezoelectric element 12 is disposed so that the first end 32 of the first electrode 18 and the first end 25 of the piezoelectric body layer 24 are in contact with the diaphragm 10 and so that the first end 34 of the second electrode 19 is not in contact with the diaphragm 10. The second end face 37 of the piezoelectric element 12 is disposed so that the second end 35 of the second electrode 19 and the second end 26 of the piezoelectric body layer 24 are in contact with the fixing plate 11 and so that the second end 33 of the first electrode 18 is not in contact with the fixing plate 11. It is only required that there occur no short circuit between the first and second electrodes 18 and 19 via the diaphragm 10 or fixing plate 11.

Figure 3C:
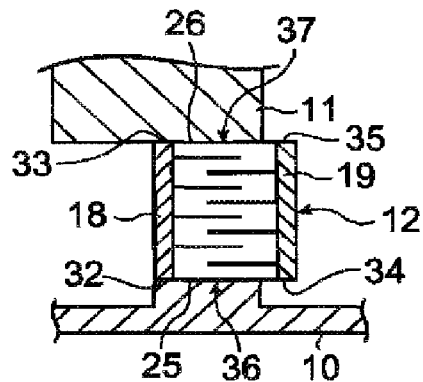

FIG. 3C is a schematic sectional view showing another example of the diaphragm, fixing plate, and piezoelectric element when the fixing plate and diaphragm are each a conductor. In this example, of the first end face 36 of the piezoelectric element 12, the first end 32 of the first electrode 18 and the first end 25 of the piezoelectric body layer 24 are in contact with the diaphragm 10; the first end 34 of the second electrode 19 is not in contact with the diaphragm 10. In the illustrated example, the diaphragm 10 and piezoelectric element 12 are relatively disposed so that a part of the first end 25 of the piezoelectric body layer 24 lies between the diaphragm 10 and the first end 34 of the second electrode 19. Also, in the FIG. 3C, the second end 33 of the first electrode 18 and the second end 26 of the piezoelectric body layer 24 included in the second end face 37 of the piezoelectric element 12 are in contact with the fixing plate 11. The fixing plate 11 and piezoelectric element 12 are relatively disposed so that a part of the second end 26 of the piezoelectric body layer 24 lies between the fixing plate 11 and the second end 35 of the second electrode 19. According to these features, the area of the part of the first end face 36 of the piezoelectric element 12 that is in contact with the diaphragm 10 is approximately equal to that of the part of the second end face 37 that is in contact with the fixing plate 11. Additionally, the part of the diaphragm 10 and the part of the fixing plate 11 between which the piezoelectric element 12 is interposed are axisymmetrical to each other. This allows the piezoelectric element 12 to be fixed stably. At least the second end 26 of the piezoelectric body layer 24 may be in contact with the fixing plate 11 with a view to fixing the piezoelectric element 12.

The positional relations among the diaphragm 10, fixing plate 11, and piezoelectric element 12 shown in FIG. 3C may be reversed. Specifically, the first end face 36 of the piezoelectric element 12 is disposed so that the first end 34 of the second electrode 19 and the first end 25 of the piezoelectric body layer 24 are in contact with the diaphragm 10 and so that the first end 32 of the first electrode 18 is not in contact with the diaphragm 10. The second end face 37 of the piezoelectric element 12 is disposed so that the second end 35 of the second electrode 19 and the second end 26 of the piezoelectric body layer 24 are in contact with the fixing plate 11 and so that the second end 33 of the first electrode 18 is not in contact with the fixing plate 11.

Figure 3D:
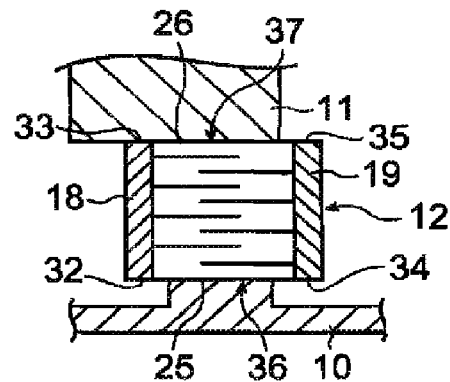

FIG. 3D is a schematic sectional view showing another example of the diaphragm, fixing plate, and piezoelectric element when the fixing plate and diaphragm are each a conductor. In this example, of the first end face 36 of the piezoelectric element 12, only the first end 25 of the piezoelectric body layer 24 is in contact with the diaphragm 10; none of the first end 32 of the first electrode 18 and the first end 34 of the second electrode 19 is not in contact with the diaphragm 10. In the illustrated example, the fixing plate 11 and piezoelectric element 12 are relatively disposed so that a part of the second end 26 of the piezoelectric body layer 24 lies between the fixing plate 11 and the second end 35 of the second electrode 19. Also, in the FIG. 3D, the second end 33 of the first electrode 18 and the second end 26 of the piezoelectric body layer 24 included in the second end face 37 of the piezoelectric element 12 are in contact with the fixing plate 11. These features allow a potential to be applied to the first electrode 18 and the second electrode 19, using the fixing plate 11 and, for example, the printed board 15 shown in FIG. 1, respectively.

At least the second end 26 of the piezoelectric body layer 24 may be in contact with the fixing plate 11. Alternatively the second end 35 of the second electrode 19 and the second end 26 of the piezoelectric body layer 24 may be in contact with the fixing plate 11.

Figure 3E:
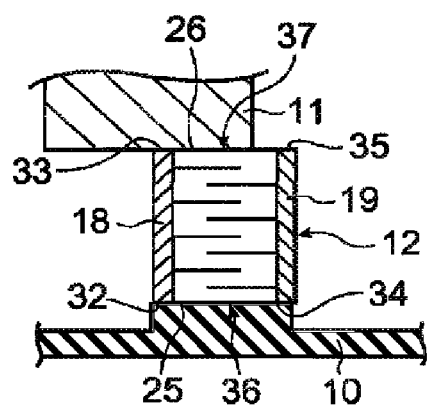

FIG. 3E is a schematic sectional view showing the diaphragm, fixing plate, and piezoelectric element when the fixing plate is a conductor and the diaphragm is an insulator. In this example, the entire first end face 36 of the piezoelectric element 12, that is, the first end 25 of the piezoelectric body layer 24, the first end 32 of the first electrode 18, and the first end 34 of the second electrode 19 is in contact with the diaphragm 10. In the illustrated example, the fixing plate 11 and piezoelectric element 12 are relatively disposed so that a part of the second end 26 of the piezoelectric body layer 24 lies between the fixing plate 11 and the second end 35 of the second electrode 19. Also, in the FIG. 3E, the second end 33 of the first electrode 18 and the second end 26 of the piezoelectric body layer 24 included in the second end face 37 of the piezoelectric element 12 are in contact with the fixing plate 11. This prevents occurrence of a short circuit between the first and second electrodes 18 and 19 via the fixing plate 11.

The diaphragm 10 is an insulator, so it may not be in contact with the first end 32 of the first electrode 18 or the first end 34 of the second electrode 19. In particular, it is preferable that the diaphragm 10 be in contact with the first end 32 of the first electrode 18 and the first end 25 of the piezoelectric body layer 24 and that a part of the first end 25 of the piezoelectric body layer 24 lie between the diaphragm 10 and the first end 34 of the second electrode 19. These features allow the fixing condition of the piezoelectric element 12 to be stabilized. At least the second end 26 of the piezoelectric body layer 24 may be in contact with the fixing plate 11. Alternatively the second end 35 of the second electrode 19 and the second end 26 of the piezoelectric body layer 24 may be in contact with the fixing plate 11.

Figure 4A:
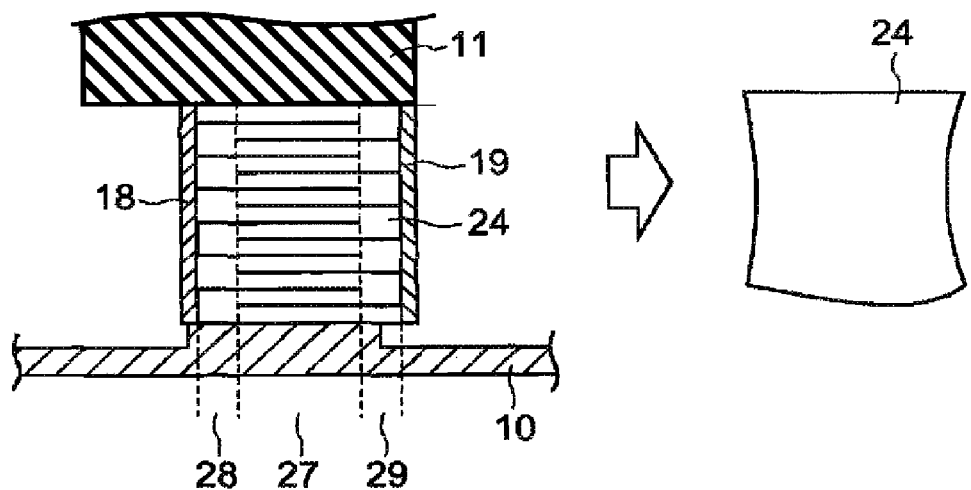
FIGS. 4A and 4B are schematic sectional views showing the respective thicknesses of a first inactive layer and a second inactive layer are different from each other depending on the disposition of the piezoelectric element.
Figure 4B:
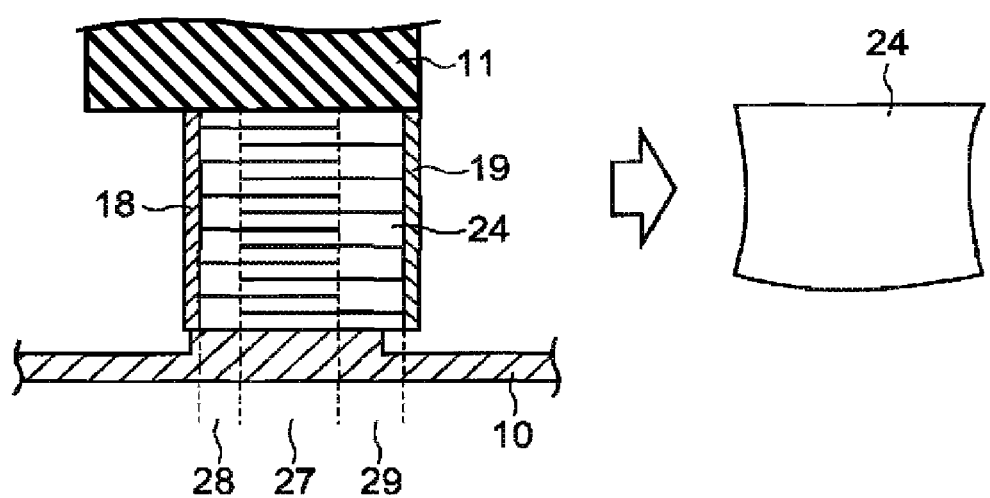

FIG. 4 is a schematic sectional view showing that the respective thicknesses of the first and second inactive layers vary depending on the disposition of the piezoelectric element. Here, positional relations among the piezoelectric element 12, diaphragm 10, and fixing plate 11 are the configuration shown in FIG. 3A described above, but other configurations may also be adopted. The piezoelectric element 12 serving as a comparative example shown in FIG. 4A is configured so that the respective thicknesses of the first inactive layer 28 (thickness between the first electrode 18 and active layer 27) and the second inactive layer 29 (thickness between the second electrode 19 and active layer 27) of the piezoelectric element 12 are equal. In this case, as shown in a right part of the drawing, the piezoelectric body layer 24 is unlikely to become deformed uniformly. On the other hand, the piezoelectric element 12 according to this embodiment shown in FIG. 4B is configured so that the thickness of the second inactive layer 29 is greater than that of the first inactive layer 28. In this case, as shown in a right part of the drawing, the piezoelectric body layer 24 is likely to become deformed uniformly.

According to the abovedescribed embodiment, it is possible to improve the uniformity of the shape of the piezoelectric element at the time of expansion/contraction of the piezoelectric element and thereby to improve the accuracy of discharging of a liquid material.

Second Embodiment

Figure 5:
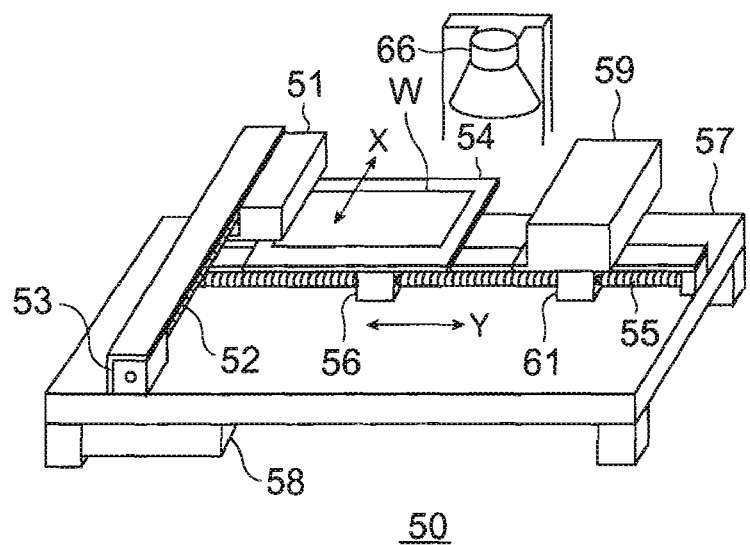
FIG. 5 is a schematic oblique perspective view showing a film forming apparatus that is one form of a droplet discharging apparatus.

FIG. 5 is an oblique perspective view showing a film forming apparatus that is one form of a droplet discharging apparatus.

As shown in FIG. 5, a film forming apparatus 50 according to this embodiment discharges a function liquid as droplets and forms a film made of the function liquid on a substrate W. The film forming apparatus 50 includes a stage 54 on which the substrate W is placed, and a head unit 51 that has a plurality of droplet discharging heads to discharge the function liquid as droplets onto the placed substrate W.

The film forming apparatus 50 also includes an X direction guide shaft 52 for driving the head unit 51 in a subscanning direction (X direction), and an X direction drive motor 53 for rotating the X direction guide shaft 52. The film forming apparatus 50 also includes a Y direction guide shaft 55 for guiding the stage 54 in a main scanning direction (Y direction), and a Y direction drive motor 56 that rotates while engaging the Y direction guide shaft 55. The film forming apparatus 50 also includes a base 57 on which the X direction guide shaft 52 and the Y direction guide shaft 55 are provided, and a controller 58 below the base 57.

The film forming apparatus 50 also includes a cleaning mechanism 59 for cleaning (recovering) a plurality of droplet discharging heads of the head unit 51, and a heater 66 for heating the discharged function liquid to evaporate and dry a solvent. Additionally, the cleaning mechanism 59 includes a Y direction drive motor 61.

The head unit 51 includes a plurality of droplet discharging heads that discharge the function liquid from nozzles (discharging ports) to apply the liquid to the substrate W. The plurality of droplet discharging heads are designed so as to discharge the function liquid individually according to discharging voltages supplied from the controller 58.

The X direction drive motor 53 is, but not limited to, a stepping motor or the like. When a drive pulse signal in the X axis direction is supplied from the controller 58, the X direction drive motor 53 causes the X direction guide shaft 52 to rotate. This causes the head unit 51 engaging the X direction guide shaft 52 to be moved in the X direction.

Similarly the Y direction drive motors 56 and 61 are each, but not limited to, a stepping motor or the like. Upon receiving a drive pulse signal in the Y axis direction from the controller 58, the Y direction drive motors 56 and 61 each rotate while engaging the Y direction guide shaft 52. This causes the stage 54 and the cleaning mechanism 59 including the Y direction drive motors 56 and 61, respectively, to be moved in the Y direction.

When the cleaning mechanism 59 cleans the droplet discharging heads, it approaches the head unit 51 and then performs 'capping' in which the cleaning mechanism 59 comes into contact with the nozzle surfaces of the droplet discharging heads to suck in the unnecessary function liquid, 'wiping' in which the cleaning mechanism 59 wipes the nozzle surfaces on which the function liquid is attached, preliminary discharging in which the cleaning mechanism 59 lets the function liquid discharge from all the nozzles of the droplet discharging heads, or a treatment in which the cleaning mechanism 59 receives the unnecessary function liquid to exhaust the droplet discharging heads.

The heater 66 is, for example, a means for performing heat treatment on the substrate W by lamp annealing, but is not limited to such a means. The heater 66 is designed to evaporate and dry the function liquid discharged onto the substrate W as well as to perform heat treatment for transforming the discharged function liquid into a film. Turn-on and turn-off of the heater 66 are also controlled by the controller 58.

The film forming apparatus 50 performs a coating operation as follows. First, predetermined drive pulses are transmitted to the X direction drive motor 53 and Y direction drive motor 56 from the controller 58 to relatively move the head unit 51 in the subscanning direction (X direction) and the stage 54 in the main scanning direction (Y direction). Then an discharging voltage is supplied from the controller 58 to the head unit 51 with the relative movement being made, causing the head unit 51 to discharge the function liquid as droplets onto a predetermined region of the substrate W.

The amount of the function liquid to be discharged as droplets from the head unit 51 can be adjusted by the magnitude of the discharging voltage supplied from the controller 58.

A droplet discharging apparatus according to the invention may be an image forming apparatus such as an ink jet printer besides being the film forming apparatus described above.

Figure 6:
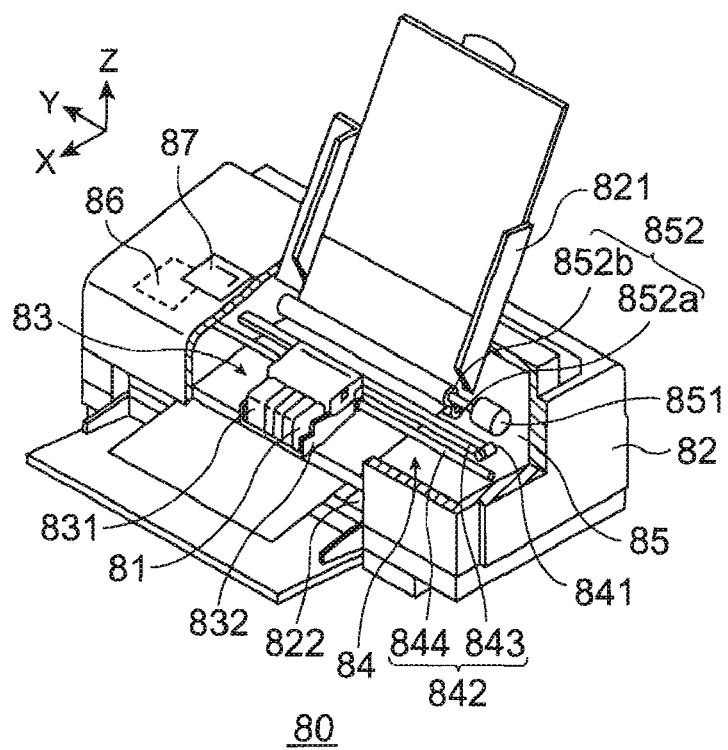
FIG. 6 is a schematic oblique perspective view showing an image forming apparatus that is one form of a droplet discharging apparatus.

FIG. 6 is a schematic oblique perspective view showing an image forming apparatus that is one form of a droplet discharging apparatus according to the invention. In particular, FIG. 6 is a schematic view of a general printer for printing images on a paper sheet or the like to which an image forming apparatus according the invention is applied. In the following description, the upper side of the printer in a Z direction of FIG. 6 is called "the upper part," and the lower side of the printer in the Z direction, "the lower part."

An ink jet printer 80 includes a main body 82, a tray 821 mounted in the back of the upper part for setting up recording sheets, an outlet 822 provided in the front of the lower part for discharging the recording sheets, and an operation panel 87 mounted on an upper part surface.

Mainly provided inside the main body 82 are a printing unit 84 including a head unit 83 that reciprocates, a feeder 85 that feeds the recording sheets one by one into the printing unit 84, and a control unit 86 that controls the printing unit 84 and the feeder 85.

The feeder 85 is designed to feed the recording sheets one by one intermittently under the control of the controller 86. An intermittently fed recording sheet passes near a lower part of the head unit 83. At this time, the head unit 83 reciprocates in a direction approximately perpendicular to the feeding direction of the recording sheet to print images on the sheet. In other words, inkjet printing is carried out with the reciprocation of the head unit 83 as the main scanning in printing, and the intermittent feeding of the recording sheets as the subscanning in printing.

The printing unit 84 includes the head unit 83, a carriage motor 841 that is a driving source of the head unit 83, and a reciprocating mechanism 842 that, according to rotation of the carriage motor 841, causes the head unit 83 to reciprocate. The head unit 83 includes in its lower part an ink jet head 81 that has multiple nozzles, an ink cartridge 831 that supplies ink to the ink jet head 81, and a carriage 832 on which the ink jet head 81 and the ink cartridge 831 are mounted.

The reciprocation mechanism 842 includes a carriage guide shaft 844 supported by a frame (not shown) at both ends, and a timing belt 843 that extends in parallel to the carriage guide shaft 844 for traveling. The carriage 832 is supported by the carriage guide shaft 844 so as to freely reciprocate, and is fixed to a part of the timing belt 843. Forward/backward travel of the timing belt 843 via a pulley by operation of the carriage motor 841 causes the head unit 83 to reciprocate while guided by the carriage guide shaft 844.

During this reciprocation the ink jet head 81 discharges ink where appropriate so as to print images on a recording sheet.

The feeder 85 includes a feeding motor 851 that is a driving force of the feeder 85, and a feeding roller 852 that rotates around a shaft by operation of the feeding motor 851.

The feeding roller 852 includes a driven roller 852a and a driving roller 852b that are vertically opposed with a recording sheet feeding path therebetween. The driving roller 852b is coupled to the feeding motor 851. These features allow the feeding roller 852 to feed multiple recording sheets set up on the tray 821 one by one toward the printing unit 84. Instead of the tray 821, a feeding cassette that contains recording sheets may be mounted detachably on the inkjet printer 80.

The control unit 86 controls printing operation by driving the printing unit 84, feeder 85, and the like, for example, based on print data received from a host computer such as a personal computer or digital camera.

Other Embodiments

The invention is not limited to the embodiments described above and various modifications can be made to those embodiments within the scope and sprit of the invention. For example, while the droplet discharging head according to the abovementioned embodiments uses the diaphragm having a protrusion and at least a part of the first end face of the piezoelectric element is in contact with the protrusion of the diaphragm, the droplet discharging head may use a diaphragm having no protrusion.

The entire disclosure of Japanese Patent Application No: 2006-075507, filed Mar. 17, 2006 is expressly incorporated by reference herein.

What is claimed is:

1. A droplet discharging head comprising:
    a diaphragm;
    a fixing plate; and
    a piezoelectric element,
    the diaphragm including a first part and a second part, the first part having a first thickness, the second part having a second thickness, the first thickness being less than the second thickness,
    the piezoelectric element including a first electrode, a second electrode, a piezoelectric body that is interposed between the first electrode and the second electrode, a first internal electrode extending from the first electrode, a second internal electrode extending from the second electrode,
    the diaphragm, the piezoelectric element, and the fixing plate being arranged toward a first direction in this order,
    when looking from the first direction, one of the first electrode and the second electrode is disposed above the first part of the diaphragm with the first thickness, with the other of the first electrode and the second electrode being disposed above the second part of the diaphragm with the second thickness.

2. The droplet discharging head according to claim 1, the second electrode being coupled to a printed board.

3. The droplet discharging head according to claim 1, further comprising:
    a base coupled to the diaphragm, the base including a pressure chamber that retains a liquid material, and a portion defining a discharging port through which the liquid material is discharged.

4. The droplet discharging head according to claim 1, further comprising:

a flow channel substrate coupled to the diaphragm, the flow channel substrate including a pressure chamber, the pressure chamber retaining a liquid material; and a nozzle plate coupled to the flow channel substrate, the nozzle plate including a portion defining a discharging port through which the liquid material is discharged.

5. An image forming apparatus comprising the droplet discharging head according to claim 1.

6. A film forming apparatus comprising the droplet discharging head according to claim 1.

7. A droplet discharging head according to claim 1, the diaphragm being conductive; and the diaphragm and the one of the first electrode and the second electrode being electrically connected.

8. A droplet discharging head according to claim 7, a first surface of the first part projecting from a second surface of the second part, the first surface and the second surface being surfaces of a side of the piezoelectric body.

9. A droplet discharging head according to claim 1, when looking from the first direction, the piezoelectric element including:

an active part, the first internal electrode and the second internal electrode overlapping at the active part;

a first inactive part, the first inactive part being a part between the active part and the first electrode; and a second inactive part, the second inactive part being a part between the active part and the second electrode, a second length of the second inactive part being larger than a first length of the first inactive part, the first length and the second length being lengths toward a second direction crossing the first direction.

10. A droplet discharging head according to claim 1, the fixing plate being conductive; and the fixing plate and the one of the first electrode and the second electrode being electrically connected.

* * * * *